(12) United States Patent
Papaefthymiou et al.

(10) Patent No.: US 8,502,569 B2
(45) Date of Patent: Aug. 6, 2013

(54) ARCHITECTURE FOR OPERATING RESONANT CLOCK NETWORK IN CONVENTIONAL MODE

(75) Inventors: Marios C. Papaefthymiou, Ann Arbor, MI (US); Alexander Ishii, Princeton, NJ (US)

(73) Assignee: Cyclos Semiconductor, Inc., Berkeley, CA (US)

( * ) Notice: Subject to any disclaimer, the term of this patent is extended or adjusted under 35 U.S.C. 154(b) by 154 days.

(21) Appl. No.: 12/903,174

(22) Filed: Oct. 12, 2010

(65) Prior Publication Data

US 2011/0084774 A1   Apr. 14, 2011

Related U.S. Application Data

(60) Provisional application No. 61/250,830, filed on Oct. 12, 2009.

(51) Int. Cl.
*H03B 1/00* (2006.01)

(52) U.S. Cl.
USPC .............................. 327/108; 327/110; 326/88

(58) Field of Classification Search
None
See application file for complete search history.

(56) References Cited

U.S. PATENT DOCUMENTS

| | | | |
|---|---|---|---|
| 4,611,135 A | 9/1986 | Nakayama et al. | |
| 5,023,480 A | 6/1991 | Gieseke et al. | |
| 5,036,217 A | 7/1991 | Rollins et al. | |
| 5,111,072 A | 5/1992 | Seidel | |
| 5,122,679 A | 6/1992 | Ishii et al. | |
| 5,146,109 A | 9/1992 | Martignoni et al. | |
| 5,311,071 A | 5/1994 | Ueda | |
| 5,332,916 A | 7/1994 | Hirai | |
| 5,384,493 A | 1/1995 | Furuki | |
| 5,396,527 A | 3/1995 | Schlecht et al. | |
| 5,410,491 A | 4/1995 | Minami | |
| 5,430,408 A | 7/1995 | Ovens et al. | |
| 5,473,526 A | 12/1995 | Svensson et al. | |
| 5,489,866 A | 2/1996 | Diba | |
| 5,504,441 A | 4/1996 | Sigal | |
| 5,506,520 A | 4/1996 | Frank et al. | |
| 5,506,528 A | 4/1996 | Cao et al. | |
| 5,508,639 A * | 4/1996 | Fattaruso | 326/97 |

(Continued)

FOREIGN PATENT DOCUMENTS

| | | |
|---|---|---|
| EP | 0953892 | 11/1999 |
| EP | 1126612 | 8/2001 |

(Continued)

OTHER PUBLICATIONS

International Search Report and Written Opinion issued in PCT/US2010/052402 on Jun. 23, 2011.

(Continued)

*Primary Examiner* — An Luu
(74) *Attorney, Agent, or Firm* — Sheppard Mullin Richter & Hampton LLP (57) ABSTRACT

An architecture for resonant clock distribution networks is proposed. The proposed architecture allows for the energy-efficient operation of the resonant clock distribution network in conventional mode, so that it meets target specifications for the clock waveform. Such an architecture is generally applicable to semiconductor devices with multiple clock frequencies, and high-performance and low-power clocking requirements such as microprocessors, ASICs, and SOCs. Moreover, it is applicable to at-speed testing and to binning of semiconductor devices according to achievable performance levels.

18 Claims, 8 Drawing Sheets

U.S. PATENT DOCUMENTS

| | | | |
|---|---|---|---|
| 5,517,145 A | 5/1996 | Frank | |
| 5,517,399 A | 5/1996 | Yamauchi et al. | |
| 5,526,319 A | 6/1996 | Dennard et al. | |
| 5,537,067 A | 7/1996 | Carvajal et al. | |
| 5,559,463 A | 9/1996 | Denker et al. | |
| 5,559,478 A | 9/1996 | Athas et al. | |
| 5,587,676 A | 12/1996 | Chowdhury | |
| 5,675,263 A | 10/1997 | Gabara | |
| 5,701,093 A | 12/1997 | Suzuki | |
| 5,734,285 A | 3/1998 | Harvey | |
| 5,760,620 A | 6/1998 | Doluca | |
| 5,838,203 A | 11/1998 | Stamoulis et al. | |
| 5,841,299 A | 11/1998 | De | |
| 5,872,489 A | 2/1999 | Chang et al. | |
| 5,892,387 A | 4/1999 | Shigehara et al. | |
| 5,896,054 A | 4/1999 | Gonzalez | |
| 5,970,074 A | 10/1999 | Ehiro | |
| 5,986,476 A | 11/1999 | De | |
| 5,999,025 A | 12/1999 | New | |
| 6,009,021 A | 12/1999 | Kioi | |
| 6,009,531 A | 12/1999 | Selvidge et al. | |
| 6,011,441 A | 1/2000 | Ghoshal | |
| 6,037,816 A | 3/2000 | Yamauchi | |
| 6,052,019 A | 4/2000 | Kwong | |
| 6,069,495 A | 5/2000 | Ciccone et al. | |
| 6,091,629 A | 7/2000 | Osada et al. | |
| 6,150,865 A | 11/2000 | Fluxman et al. | |
| 6,160,422 A | 12/2000 | Huang | |
| 6,169,443 B1 | 1/2001 | Shigehara et al. | |
| 6,177,819 B1 | 1/2001 | Nguyen | |
| 6,230,300 B1 | 5/2001 | Takano | |
| 6,242,951 B1 | 6/2001 | Nakata et al. | |
| 6,278,308 B1 | 8/2001 | Partovi et al. | |
| 6,323,701 B1 | 11/2001 | Gradinariu et al. | |
| RE37,552 E | 2/2002 | Svensson et al. | |
| 6,433,586 B2 | 8/2002 | Ooishi | |
| 6,438,422 B1 | 8/2002 | Schu et al. | |
| 6,477,658 B1 | 11/2002 | Pang | |
| 6,538,346 B2 | 3/2003 | Pidutti et al. | |
| 6,542,002 B2 | 4/2003 | Jang et al. | |
| 6,559,681 B1 | 5/2003 | Wu et al. | |
| 6,563,362 B2 | 5/2003 | Lambert | |
| 6,608,512 B2 | 8/2003 | Ta et al. | |
| 6,720,815 B2 | 4/2004 | Mizuno | |
| 6,742,132 B2 | 5/2004 | Ziesler et al. | |
| 6,777,992 B2 | 8/2004 | Ziesler et al. | |
| 6,856,171 B1 | 2/2005 | Zhang | |
| 6,879,190 B2 | 4/2005 | Kim et al. | |
| 6,882,182 B1 | 4/2005 | Conn et al. | |
| 7,005,893 B1 | 2/2006 | Athas et al. | |
| 7,145,408 B2 | 12/2006 | Shepard et al. | |
| 7,215,188 B2 | 5/2007 | Ramaraju et al. | |
| 7,227,425 B2 | 6/2007 | Jang et al. | |
| 7,233,186 B2 | 6/2007 | Ishimi | |
| 7,301,385 B2 | 11/2007 | Takano et al. | |
| 7,307,486 B2 | 12/2007 | Pernia et al. | |
| 7,355,454 B2 | 4/2008 | Papaefthymiou et al. | |
| 7,567,110 B2 | 7/2009 | Shionoya | |
| 7,622,997 B2 | 11/2009 | Papaefthymiou et al. | |
| 7,719,316 B2 | 5/2010 | Chueh et al. | |
| 7,719,317 B2 | 5/2010 | Chueh et al. | |
| 7,956,664 B2 | 6/2011 | Chueh et al. | |
| 7,973,565 B2 | 7/2011 | Ishii et al. | |
| 8,237,484 B2 | 8/2012 | Kaviani et al. | |
| 2001/0013795 A1 | 8/2001 | Nojiri | |
| 2002/0140487 A1 | 10/2002 | Fayneh et al. | |
| 2003/0189451 A1 | 10/2003 | Ziesler et al. | |
| 2005/0057286 A1 | 3/2005 | Shepard et al. | |
| 2005/0114820 A1 | 5/2005 | Restle | |
| 2006/0082387 A1 | 4/2006 | Papaefthymiou et al. | |
| 2006/0152293 A1 | 7/2006 | McCorquodale et al. | |
| 2007/0096957 A1 | 5/2007 | Papaefthymiou et al. | |
| 2007/0168786 A1 | 7/2007 | Drake et al. | |
| 2007/0216462 A1 | 9/2007 | Ishimi | |
| 2008/0136479 A1 | 6/2008 | You et al. | |
| 2008/0150605 A1 | 6/2008 | Chueh et al. | |
| 2008/0150606 A1 | 6/2008 | Kumata | |
| 2008/0164921 A1 | 7/2008 | Shin | |
| 2008/0303576 A1 | 12/2008 | Chueh et al. | |
| 2009/0027085 A1 | 1/2009 | Ishii et al. | |
| 2011/0084736 A1 | 4/2011 | Papaefthymiou et al. | |
| 2011/0084772 A1 | 4/2011 | Papaefthymiou et al. | |
| 2011/0084773 A1 | 4/2011 | Papaefthymiou et al. | |
| 2011/0084774 A1 | 4/2011 | Papaefthymiou et al. | |
| 2011/0084775 A1 | 4/2011 | Papaefthymiou et al. | |
| 2011/0090018 A1* | 4/2011 | Papaefthymiou et al. | 331/117 FE |
| 2011/0090019 A1 | 4/2011 | Papaefthymiou et al. | |
| 2011/0109361 A1 | 5/2011 | Nishio | |
| 2011/0140753 A1 | 6/2011 | Papaefthymiou et al. | |
| 2011/0210761 A1 | 9/2011 | Ishii et al. | |
| 2011/0215854 A1 | 9/2011 | Chueh et al. | |

FOREIGN PATENT DOCUMENTS

| | | |
|---|---|---|
| EP | 1764669 | 3/2007 |
| JP | 63246865 | 10/1988 |
| JP | 7321640 A | 12/1995 |
| JP | 3756285 | 1/2006 |
| WO | 2005092042 | 10/2005 |

OTHER PUBLICATIONS

Athas et al., "Low-Power Digital Systems Based on Adiabatic-Switching Principles," IEEE Transactions on Very Large Scale Integration (VLSI) Systems, vol. 2, No. 4, pp. 398-407, Dec. 1994.

Chan et al., "1.1 to 1.6GHz Distributed Differential Oscillator Global Clock Network," International Solid-State Circuits Conference, pp. 518-519, Feb. 9, 2005.

Chan et al., "A 4.6GHz Resonant Global Clock Distribution Network," IEEE International Solid-State Circuits Conference, Feb. 18, 2004.

Chan et al., "A Resonant Global Clock Distribution for the Cell Broadband Engine Processor," IEEE Journal of Solid State Circuits, vol. 44, No. 1, pp. 64-72, Jan. 2009.

Chan et al., "Design of Resonant Global Clock Distributions," Proceedings of the 21st International Conference on Computer Design, pp. 248-253, Oct. 2003.

Chueh et al., "900MHz to 1.2GHz Two-Phase Resonant Clock Network with Programmable Driver and Loading," IEEE Custom Integrated Circuits Conference, pp. 777-780, Sep. 2006.

Chueh et al., "Two-Phase Resonant Clock Distribution," Proceedings of the IEEE Computer Society Annual Symposium on VLSI: New Frontiers on Vlsi Design, May 2005.

Cooke et al., "Energy Recovery Clocking Scheme and Flip-Flops for Ultra Low-Energy Application," International Symposium on Low-Power Electronic Design, pp. 54-59, Aug. 25-27, 2003.

Drake et al., "Resonant Clocking Using Distributed Parasitic Capacitance," IEEE Journal of Solid-State Circuits, vol. 39, No. 9, pp. 1520-1528, Sep. 2004.

Dunning, Jim, "An All-Digital Phase-Locked Loop with 50-Cycle Lock Time Suitable for High-Performance Microprocessors," IEEE Journal of Solid-State Circuits, vol. 30, No. 4, pp. 412-422, Apr. 1995.

Fang et al., "A High-Performance Asynchronous FPGA: Test Results," Proceedings of the 13th Annual IEEE Symposium on Field-Programmable Custom Computing Machines, Apr. 2005.

Favalli et al., "Testing Scheme for IC's Clocks," IEEE European Design and Test Conference, Mar. 1997.

Gutnik et al., "Active GHz Clock Network Using Distributed PLLs," IEEE Journal of Solid-State Circuits, vol. 35, No. 11, pp. 1553-1560, Nov. 2000.

Ishii et al., "A Resonant-Clock 200MHz ARM926EJ-S(TM) Microcontroller," European Solid-State Circuits Conference, Sep. 2009.

Kim et al., "Energy Recovering Static Memory," Proceedings of the 2002 International Symposium on Low Power Electronics and Design, pp. 92-97, Aug. 12-14, 2002.

Maksimovic et al., "Design and Experimental Verification of a CMOS Adiabatic Logic with Single-Phase Power-Clock Supply," Proceedings of the 40th Midwest Symposium on Circuits and Systems, pp. 417-420, Aug. 1997.

Maksimovic et al., "Integrated Power Clock Generators for Low Energy Logic," IEEE Annual Power Electronics Specialists Conference, vol. 1, pp. 61-67, Jun. 18-22, 1995.

Moon et al., "An Efficient Charge Recovery Logic Circuit," IEEE Journal of Solid-State Circuits, vol. 31, No. 4, pp. 514-522, Apr. 1996.

Sathe et al., "A 0.8-1.2GHz Frequency Tunable Single-Phase Resonant-Clocked FIR Filter with Level-Sensitive Latches," IEEE 2007 Custom Integrated Circuits Conference, pp. 583-586, Sep. 2007.

Sathe et al., "A 1.1GHz Charge-Recovery Logic," IEEE International Solid-State Circuits Conference, Feb. 7, 2006.

Sathe et al., "A 1GHz Filter with Distributed Resonant Clock Generator," IEEE Symposium on VLSI Circuits, pp. 44-45, Jun. 2007.

Sathe et al., "Resonant-Clock Latch-Based Design," IEEE Journal of Solid-State Circuits, vol. 43, No. 4, pp. 864-873, Apr. 2008.

Teifel et al., "Highly Pipelined Asynchronous FPGAs," Proceedings of the 2004 ACM/SIGDA 12th International Symposium on Field Programmable Gate Arrays, pp. 133-142, Feb. 22-24, 2004.

Weste et al., "Principles of CMOS VLSI Design: A Systems Perspective," 2nd Edition, Addison-Wesley, pp. 9-11, 1992.

Ziesler et al., "A 225 MHz Resonant Clocked ASIC Chip," Proceedings of the 2003 International Symposium on Low Power Electronics and Design, pp. 48-53, Aug. 25-27, 2003.

Ziesler et al., "A Resonant Clock Generator for Single-Phase Adiabatic Systems," Proceedings of the 2001 International Symposium on Low Power Electronics and Design, pp. 159-164, Aug. 6-7, 2001.

Ziesler et al., "Energy Recovering ASIC Design," Proceedings of the IEEE Computer Society Annual Symposium on VLSI, Feb. 20-21, 2003.

Search Report and Written Opinion from International Serial No. PCT/US2007/086304 mailed Mar. 3, 2009.

Search Report and Written Opinion from International Serial No. PCT/US2008/064766 mailed Dec. 22, 2008.

Search Report and Written Opinion from International Serial No. PCT/US2010/052390 mailed Jun. 23, 2011.

Search Report and Written Opinion from International Serial No. PCT/US2010/052393 mailed Jun. 23, 2011.

Search Report and Written Opinion from International Serial No. PCT/US2010/052395 mailed Jun. 23, 2011.

Search Report and Written Opinion from International Serial No. PCT/US2010/052396 mailed Jun. 23, 2011.

Search Report and Written Opinion from International Serial No. PCT/US2010/052397 mailed Jun. 23, 2011.

Search Report and Written Opinion from International Serial No. PCT/US2010/052401 mailed Jun. 29, 2011.

Search Report and Written Opinion from International Serial No. PCT/US2010/052405 mailed Jun. 23, 2011.

Search Report from International Serial No. PCT/US2003/010320 mailed Sep. 29, 2003.

Supplementary European Search Report from European Serial No. 03716979.4 mailed Jun. 7, 2006.

Taskin, Baris et al., "Timing-Driven Physical Design for VLSI Circuits Using Resonant Rotary Clocking," 49th IEEE International Midwest Symposium on Circuits and Systems, pp. 261-265, Aug. 6, 2006.

* cited by examiner

ARCHITECTURE FOR OPERATING RESONANT CLOCK NETWORK IN CONVENTIONAL MODE

CLAIM OF PRIORITY AND RELATED APPLICATIONS

This patent application is a conversion of and claims priority to U.S. Provisional Patent Application No. 61/250,830, entitled SYSTEMS AND METHODS FOR RESONANT CLOCKING INTEGRATED CIRCUITS, filed Oct. 12, 2009, which is incorporated herein in its entirety. This patent application is related to the technologies described in the following patents and applications, all of which are incorporated herein in their entireties:

U.S. patent application Ser. No. 12/125,009, entitled RESONANT CLOCK AND INTERCONNECT ARCHITECTURE FOR DIGITAL DEVICES WITH MULTIPLE CLOCK NETWORKS, filed Oct. 12, 2009, which claims priority to U.S. Provisional Patent Application No. 60/931,582, entitled RESONANT CLOCK AND INTERCONNECT ARCHITECTURE FOR PROGRAMMABLE LOGIC DEVICES, filed May 23, 2007;

U.S. patent application Ser. No. 12/903,154, entitled RESONANT CLOCK DISTRIBUTION NETWORK ARCHITECTURE WITH PROGRAMMABLE DRIVERS, filed Oct. 12, 2010;

U.S. patent application Ser. No. 12/903,158, entitled ARCHITECTURE FOR CONTROLLING CLOCK CHARACTERISTICS, filed Oct. 12, 2010;

U.S. patent application Ser. No. 12/903,163, entitled METHOD FOR SELECTING NATURAL FREQUENCY IN RESONANT CLOCK DISTRIBUTION NETWORKS WITH NO INDUCTOR OVERHEAD, filed Oct. 12, 2010;

U.S. patent application Ser. No. 12/903,166, entitled ARCHITECTURE FOR ADJUSTING NATURAL FREQUENCY IN RESONANT CLOCK DISTRIBUTION NETWORKS, filed Oct. 12, 2010;

U.S. patent application Ser. No. 12/903,168, entitled ARCHITECTURE FOR FREQUENCY-SCALED OPERATION IN RESONANT CLOCK DISTRIBUTION NETWORKS, filed Oct. 12, 2010;

U.S. patent application Ser. No. 12/903,172, entitled ARCHITECTURE FOR SINGLE-STEPPING IN RESONANT CLOCK DISTRIBUTION NETWORKS, filed Oct. 12, 2010;

U.S. patent application Ser. No. 12/903,174, entitled ARCHITECTURE FOR OPERATING RESONANT CLOCK NETWORK IN CONVENTIONAL MODE, filed Oct. 12, 2010; and U.S. patent application Ser. No. 12/903,188, entitled RESONANT CLOCK DISTRIBUTION NETWORK ARCHITECTURE FOR TRACKING PARAMETER VARIATIONS IN CONVENTIONAL CLOCK DISTRIBUTION NETWORKS filed Oct. 12, 2010.

FIELD OF INVENTION

This disclosure relates generally to clock distribution network architectures for digital devices with multiple clock networks and various clock frequencies such as microprocessors, application-specific integrated circuits (ASICs), and System-on-a-Chip (SOC) devices.

BACKGROUND OF THE INVENTION

Resonant clock distribution networks have been proposed for the energy-efficient distribution of clock signals in synchronous digital systems. In these networks, energy-efficient operation is achieved using one or more inductors to resonate the parasitic capacitance of the clock distribution network. Clock distribution with extremely low jitter is achieved through the reduction in the number of clock buffers. Moreover, extremely low skew is achieved among the distributed clock signals through the design of relatively symmetric all-metal distribution networks. Overall network performance depends on operating speed and total network inductance, resistance, size, and topology, with lower-resistance symmetric networks resulting in lower jitter, skew, and energy consumption when designed with adequate inductance.

In practice, digital devices are often specified and designed to operate at multiple clock frequencies. For example, a high-performance microprocessor may be designed to operate at multiple clock frequencies ranging from 100 MHz to 3 GHz. The technique of operating a clock signal at different clock frequencies over time is commonly referred to as frequency scaling and is motivated by the need to reduce power consumption in semiconductor devices. Power consumption in digital semiconductor devices grows in proportion with the rate at which these devices switch between their digital values. When performance requirements decrease, this rate can be reduced by reducing the frequency of the clock signal, thereby reducing power consumption.

The operation of clock signals at more than a single frequency also arises in the context of device binning, that is, the practice of selling at a premium a device that, due to manufacturing variations, is capable of operating at a higher peak clock frequency than another device of identical design and functionality. For example, a batch of microprocessors that was fabricated on a "fast" semiconductor manufacturing corner may contain microprocessors capable of running at clock frequencies of up to 3 GHz, while an identical-in-design batch of microprocessors that was fabricated on a "typical" semiconductor manufacturing corner may contain microprocessors that can run at clock frequencies of at most 2 GHz. While of identical design, the microprocessors in the first "fast" batch can be sold at significantly higher prices, due to their better achieved performance.

The challenge with the deployment of resonant clock distribution networks in multi-frequency operation contexts is that these networks typically achieve their highest energy efficiency for a relatively narrow range of clock frequencies centered around the natural frequency of the resonant network. For clock frequencies outside this narrow range, energy efficiency degrades significantly, and to an extent that outweighs the inherent energy advantages of resonant clocking. For example, consider a microprocessor that has been designed with a target frequency of 3 GHz, but its digital logic can only achieve a peak clock rate of 2 GHz after manufacturing. In a non-resonant clock implementation of the microprocessor, the clock network can be operated at 2 GHz, consuming power in proportion to its 2 GHz operating frequency. In a resonant clock design, however, if the resonant clock network operates at 2 GHz, instead of its natural frequency of 3 GHz, its power consumption may significantly exceed the power consumption of the non-resonant design at 2 GHz. As a general principle, it is desirable that the design with the resonant clock network does not consume more power than its counterpart with a conventional clock network under all operating frequencies.

In addition to excessive power consumption, when a resonant clock network operates away from its natural frequency, the shape of the clock waveform is increasingly deformed, as the mismatch between the natural and the operating frequency increases. In extreme situations, the peak clock frequency after manufacturing may be so far from the natural frequency of the resonant clock network that the clock waveform at the peak clock frequency becomes deformed to such an extent that incorrect operation of the clocked elements results, and the function of the overall device becomes faulty.

At-speed testing presents yet another challenge related with the use of resonant clock distribution networks in digital devices. In this kind of testing, a specific bit pattern is first loaded onto specified scan registers (scan-in mode) using a clock frequency that is significantly slower (for example, 5 times or more) than the target clock frequency that operation is to be tested at. The digital system is then operated for one or more clock cycles at the target clock frequency (at-speed-test mode), and to validate correct function, the contents of the scan registers are then read (scan-out mode) using a clock frequency that is once again significantly slower than the target clock frequency. Resonant clock distribution networks typically require multiple clock cycles of operation before they are able to provided their specified clock amplitude. Therefore, switching from scan-in mode to at-speed-test mode (or from at-speed-test mode to scan-out mode) is a challenge, due to the requirement for full-amplitude clock signals right from the beginning of the at-speed-test mode, and due to the difference in the clock frequencies between the scan modes and the at-speed-test mode. Furthermore, the great difference in clock frequency between scan modes and at-speed-test mode implies a significant difference in the rise and/or fall time of the clock waveform, and typically it is critical that the rise and/or fall times during at-speed testing match that of the resonant clock waveform at the same frequency when the network is operating in resonant mode.

An approach that can be used to address the above challenges is to essentially disable the inductive elements of the resonant clock network, and thereby allow the clock drivers to swing the normally resonant clock distribution network in a conventional (i.e., non-resonant) mode. The energy efficiency of the resonant clock network and the characteristics of the clock waveform depend on the way that the inductive elements are disabled. Consequently, in a resonant clock distribution network that allows for the disabling of its inductive elements, to ensure that energy efficiency remains high and that the clock waveform meets its target specification, certain resonant clock network architectures are preferable.

Architectures for resonant clock distribution networks have been described and empirically evaluated in several articles, including "A 225 MHz Resonant Clocked ASIC Chip," by Ziesler C., et al., *International Symposium on Low-Power Electronic Design*, August 2003; "Energy Recovery Clocking Scheme and Flip-Flops for_Ultra Low-Energy Applications," by Cooke, M., et al., *International Symposium on Low-Power Electronic Design*, August 2003; and "Resonant Clocking Using Distributed Parasitic Capacitance," by Drake, A., et al., *Journal of Solid-State Circuits*, Vol. 39, No. 9, September 2004; "900 MHz to 1.2 GHz two-phase resonant clock network with programmable driver and loading," by Chueh J.-Y., et al., *IEEE 2006 Custom Integrated Circuits Conference*, September 2006; "A 0.8-1.2 GHz frequency tunable single-phase resonant-clocked FIR filter," by Sathe V., et al., *IEEE 2007 Custom Integrated Circuits Conference*, September 2007. However, the resonant clock networks described in all these articles always operate in resonant mode. Moreover, the resonant clock distribution networks described in these articles do not describe any approaches for disabling their inductive elements A resonant clock distribution network design that can also operate in conventional mode is mentioned in the article "A Resonant Global Clock Distribution for the Cell Broadband Engine Processor," by Chan S., et al., *IEEE Journal of Solid State Circuits*, Vol. 44, No. 1, January 2009. However, the article does not provide any specifics of such a clock network design, such as circuit topologies and any design and optimization issues associated with them, and therefore is purely conceptual with respect to the use of conventional mode operation.

Overall, the examples herein of some prior or related systems and their associated limitations are intended to be illustrative and not exclusive. Other limitations of existing or prior systems will become apparent to those of skill in the art upon reading the following Detailed Description.

SUMMARY OF THE DESCRIPTION

An architecture for resonant clock distribution networks is proposed. The proposed architecture allows for the energy-efficient operation of the resonant clock distribution network in conventional mode, so that it meets target specifications for the clock waveform. Such an architecture is generally applicable to semiconductor devices with multiple clock frequencies, and high-performance and low-power clocking requirements such as microprocessors, ASICs, and SOCs. Moreover, it is applicable to at-speed testing and to binning of semiconductor devices according to achievable performance levels.

Disclosed is a clock driver comprising: a resonance element electrically coupled to a clock node of the clock driver, the resonance element configured to enable the clock driver to operate in a resonant mode; a drive element electrically coupled to the clock node, the drive element configured to receive and propagate a reference clock of the clock distribution network based on a logical input signal; a mid-point supply node configured to provide a power supply to the resonance element; a first switch element, wherein a first end of the first switch element is electrically coupled to the mid-point supply node and a second end of the first switch element is electrically coupled to a first end of the resonance element; a second switch element connected in parallel to the resonance element, wherein a first end of the second switch element is electrically coupled to the first end of the resonance element and a second end of the second switch element is electrically coupled to a second end of the resonance element; wherein, the clock driver is configured to selectively operate either in a resonant mode or a non-resonant mode based on an operating state of the first switch element and the second switch element, wherein: when the first switch element is switched on and the second switch element is switched off, the clock driver operates in a resonant mode; and when the second switch element is switched on, the resonance element is bypassed and the clock driver operates in a non-resonant mode.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Other advantages and features will become apparent from the following description and claims. It should be understood that the description and specific examples are intended for purposes of illustration only and not intended to limit the scope of the present disclosure.

BRIEF DESCRIPTION OF DRAWINGS

These and other objects, features and characteristics of the present invention will become more apparent to those skilled in the art from a study of the following detailed description in conjunction with the appended claims and drawings, all of which form a part of this specification. In the drawings:

The headings provided herein are for convenience only and do not necessarily affect the scope or meaning of the claimed invention.

In the drawings, the same reference numbers and any acronyms identify elements or acts with the same or similar structure or functionality for ease of understanding and convenience.

DETAILED DESCRIPTION OF THE INVENTION

Various examples of the invention will now be described. The following description provides specific details for a thorough understanding and enabling description of these examples. One skilled in the relevant art will understand, however, that the invention may be practiced without many of these details. Likewise, one skilled in the relevant art will also understand that the invention can include many other obvious features not described in detail herein. Additionally, some well-known structures or functions may not be shown or described in detail below, so as to avoid unnecessarily obscuring the relevant description.

The terminology used below is to be interpreted in its broadest reasonable manner, even though it is being used in conjunction with a detailed description of certain specific examples of the invention. Indeed, certain terms may even be emphasized below; however, any terminology intended to be interpreted in any restricted manner will be overtly and specifically defined as such in this Detailed Description section.

Figure 1:
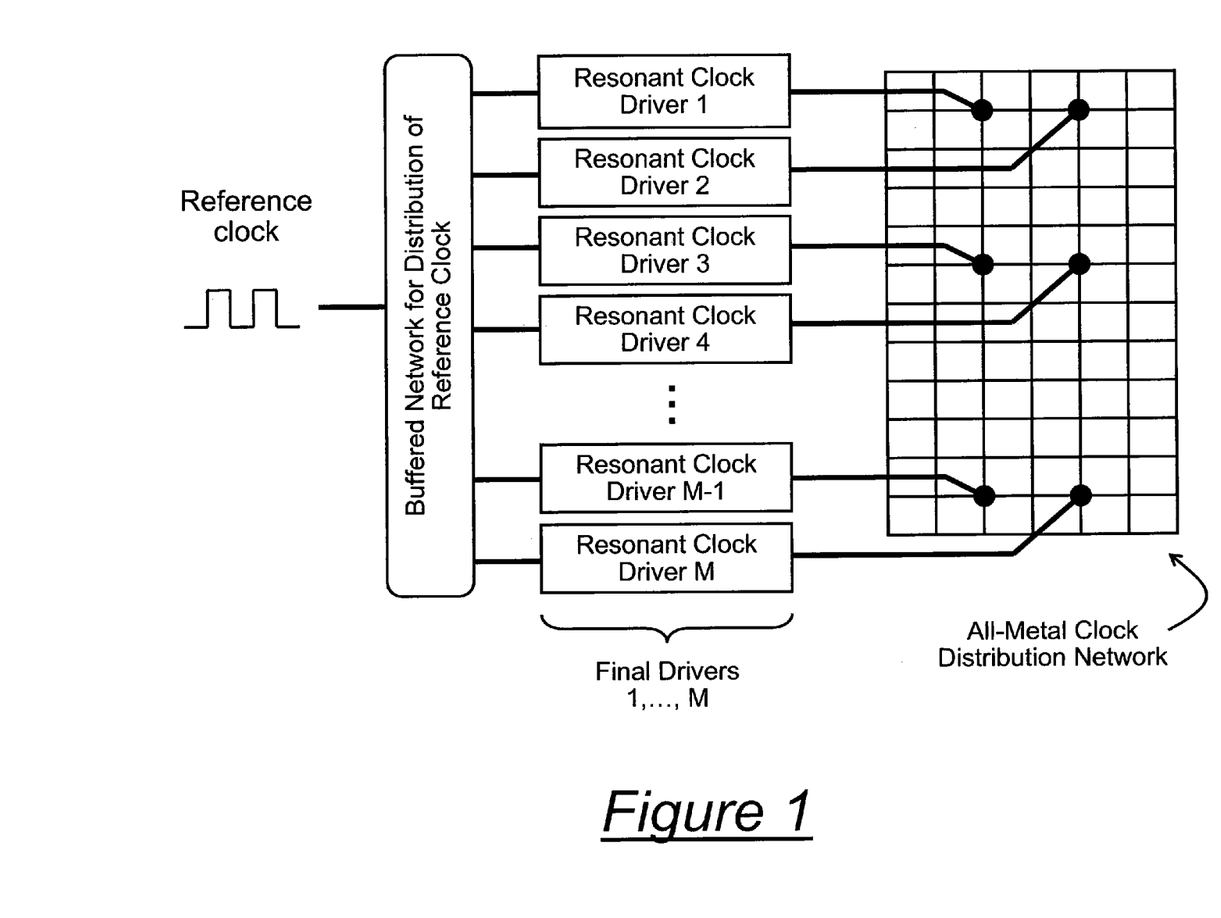
FIG. 1 shows a typical architecture of a resonant clock distribution network.

FIG. 1 shows a typical resonant clock distribution network architecture for a semiconductor device. In this network, a buffered distribution network is used to distribute a reference clock signal to multiple resonant clock drivers that are in turn used to drive the clock signal across an all-metal clock distribution network. Typically, this all-metal network has an approximately symmetric topology, delivering the clock signal to the clocked elements (for example, flip-flops and clock gaters) of the semiconductor device with very low skew. Each resonant clock driver incorporates an inductor that is used to provide additional drive strength with low energy consumption by resonating the parasitic capacitance of the load seen by the driver.

Figure 2:
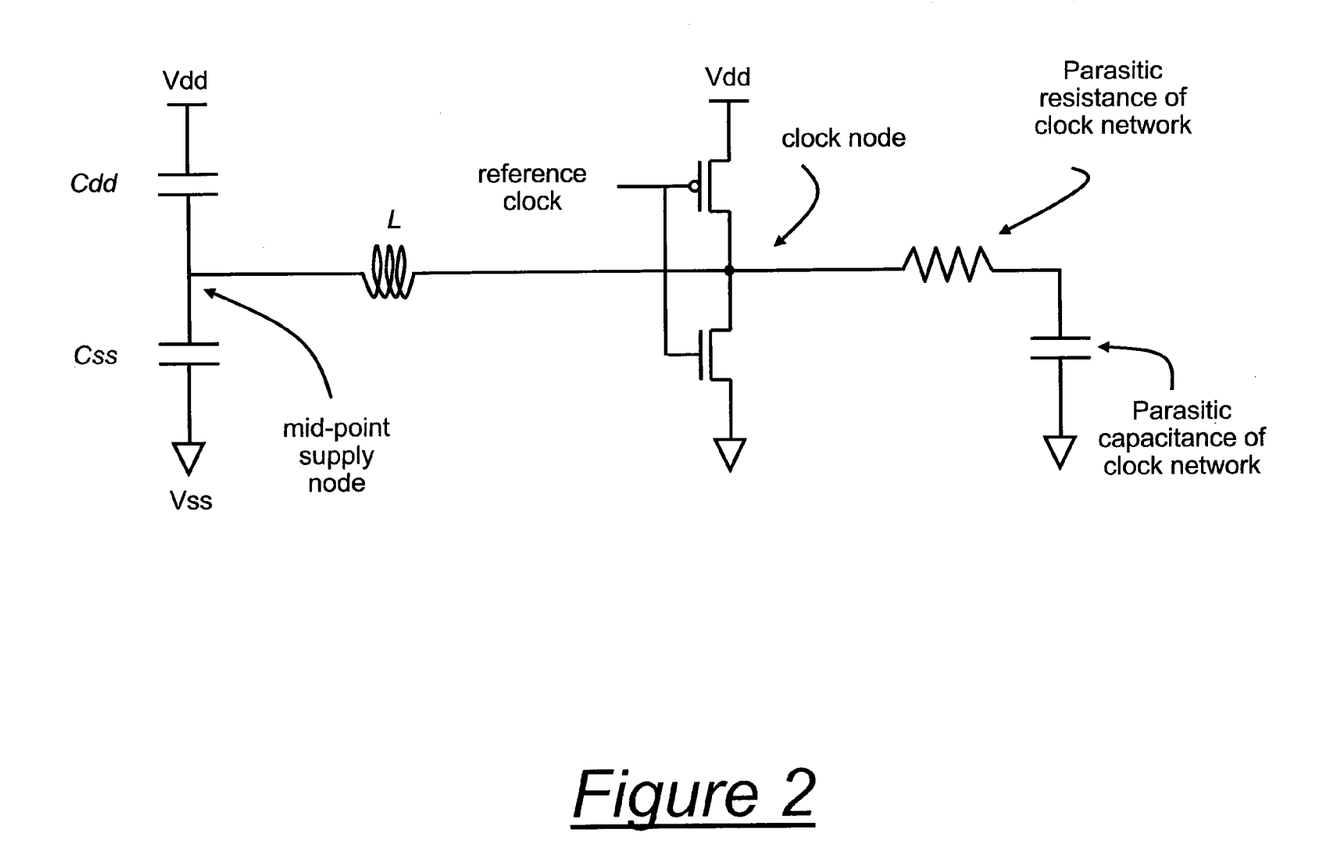
FIG. 2 shows a typical driver design for resonant clocking with the clock load modeled as a lumped capacitor.

FIG. 2 shows a typical resonant clock driver design, in which the part of the overall clock distribution network serviced by the resonant clock driver, is modeled as a lumped capacitor C in series with a lumped resistance R. This driver comprises a pull-up PMOS and a pull-down NMOS device for driving the clock. The PMOS device is connected between the clock node and the power supply terminal. The NMOS device is connected between the clock node and the ground terminal. Both devices are driven by the reference clock signal. An inductor L is connected between the clock node and a supply node with voltage at approximately the mid-point of the clock signal oscillation. For example, if the clock signal oscillates between 0V and 1V, the mid-point supply voltage is approximately 0.5V. In the driver of this figure, the mid-point is implemented using two capacitors Cdd and Css. Capacitor Cdd is connected between the mid-point and the power supply terminal. Capacitor Css is connected between the mid-point and the ground terminal. To maximize energy savings, the value of the inductor is approximately chosen so that the LC tank set-up by the inductor and the parasitic capacitance of the clock distribution network has a natural frequency that is approximately equal to the frequency of the reference clock signal.

The energy efficiency of the resonant clock driver depends on various design and operating parameters. The quality factor Q of the resonant system is an indicator of its energy efficiency. This factor is proportional to $(L/C)^{1/2}/R$. In general, energy efficiency decreases as R increases, due to the $I^2R$ losses associated with the flow of the current I that charges and discharges the parasitic clock load C through the resistance R. Also, for a fixed natural frequency, energy efficiency decreases as capacitance C increases, since the current flowing through resistance R increases.

The mismatch between the natural frequency of the resonant LC-tank systems and the frequency of the reference clock signal is another important factor that affects the energy efficiency of the resonant clock network. As the frequency of the reference clock that drives the resonant clock driver moves further away from the natural frequency of the resonant clock driver's LC-tank, energy efficiency decreases. When the mismatch between the two frequencies becomes too large, the energy consumption of the resonant clock driver becomes excessive and impractically high. Moreover, the shape of the clock waveform is so distorted that it cannot be reliably used to clock flip-flops or other clocked storage elements. Consequently, resonant clock drivers tend to have a narrower range of clock frequencies within which they operate efficiently than the range of clock frequencies typically supported by a semiconductor device that uses frequency scaling.

Figure 3:
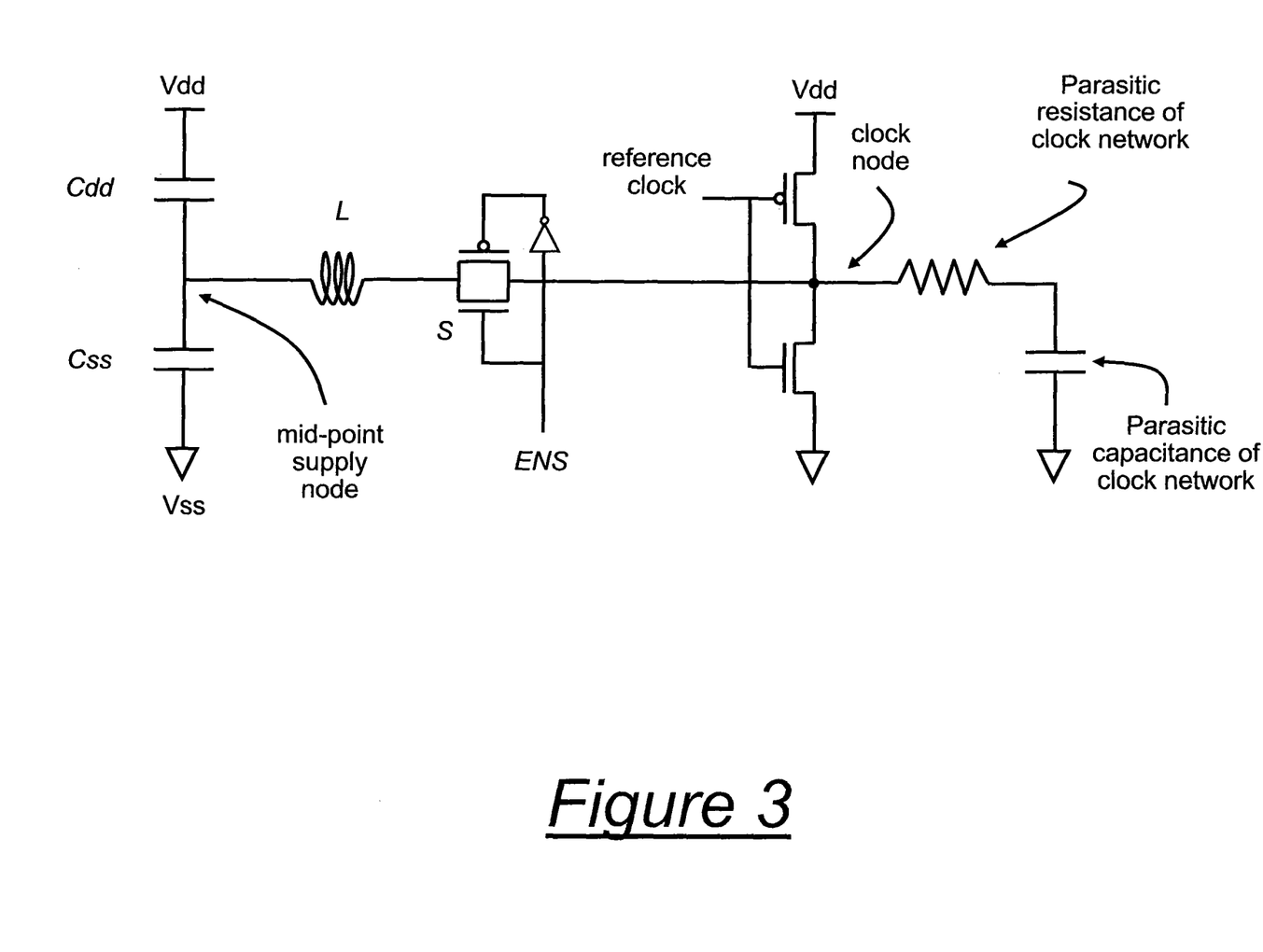
FIG. 3 shows an approach to the design of a resonant driver that supports both resonant and conventional operation.

To support the broad range of operating frequencies used in a frequency-scaled semiconductor device, and to provide support for at-speed testing, resonant clock drivers are designed so that the resonant clock network can also be operated in conventional mode. FIG. 3 shows a possible resonant clock driver design which supports operation in resonant and conventional mode. This design is an adaptation of the resonant clock driver in FIG. 2, which has been extended to include a switch S between the clock node and the inductor terminal that is connected to the clock node. In this design, the switch S has been implemented as a transmission gate with a PMOS and an NMOS device. Switch S can be used to disable the inductor by selectively decoupling it from the clock node, thus providing the option of driving the clock network in conventional (i.e., non-resonant mode). When the control signal ENS turns the switch on, the inductor is part of the resonant clock network, and the resonant clock driver operates the resonant clock network in resonant mode. When the control signal ENS turns the switch off, the inductor is decoupled from the resonant clock network, and the resonant clock driver operates the resonant clock network in conventional mode.

The architecture of the resonant clock driver shown in FIG. 3 has certain advantages and disadvantages. The main advantage is that it completely decouples the inductor from the resonant clock network. Therefore, when the network is operating, the inductor does not affect the characteristics of the clock waveform in any significant way. However, the main disadvantage of this architecture is that when the resonant clock network is operating in resonant mode, the parasitic capacitance of switch S is part of the clock load that is driven by the clock driver. It therefore exhibits an increased total clock capacitance on the clock node, compared to a conventional clock network design, thus limiting the relative energy savings potential of resonant clock distribution.

Figure 4:
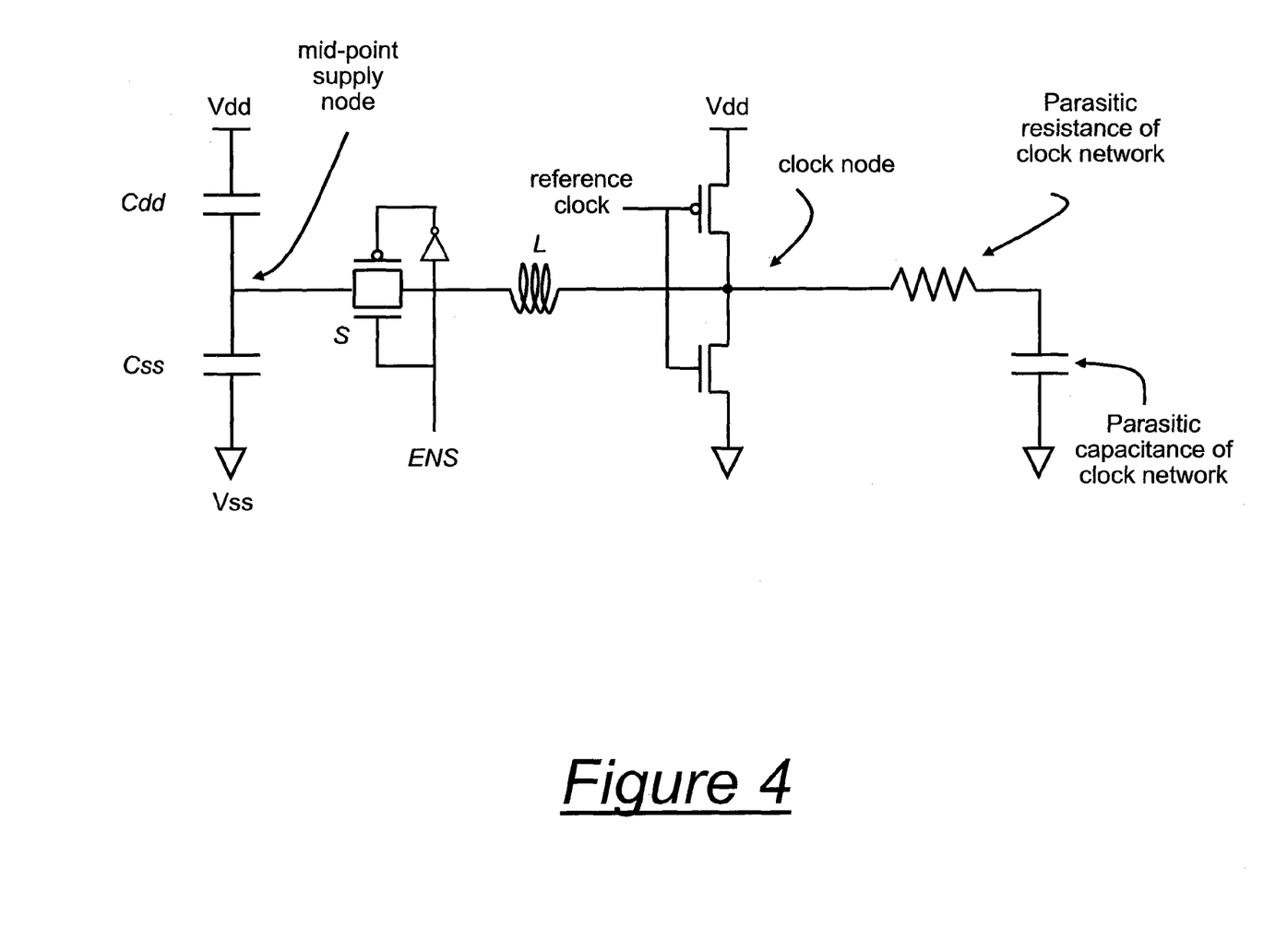
FIG. 4 shows an alternative approach to the design of a resonant clock driver that supports both resonant and conventional operation.

FIG. 4 shows an alternative resonant clock driver design which supports operation in resonant and conventional mode, and overcomes some of the disadvantages of the resonant clock driver design shown in FIG. 3. In this driver design, switch S has been connected between the mid-point supply node and the inductor terminal that is originally connected to that node. In this design, switch S has been implemented as a transmission gate with a PMOS and an NMOS device. Switch S can be used to disable the inductor by selectively decoupling it from the mid-point supply node, thus providing the option of driving the clock network in conventional mode. When the control signal ENS turns the switch on, the inductor is part of the resonant clock network, and the resonant clock driver operates the resonant clock network in resonant mode. When the control signal ENS turns the switch off, the inductor is decoupled from the mid-point supply node, and the resonant clock driver operates the resonant clock network in conventional mode. In this design, when the resonant clock network is operating in resonant mode, the capacitance of switch S is combined with the capacitors Cdd and Css that yield the mid-point supply voltage. Therefore, this capacitance is not part of the clock node, and the relative energy savings potential of the resonant clock distribution network is not limited as with the driver design shown in FIG. 3.

A main disadvantage of the resonant clock driver design in FIG. 4 is that when the resonant clock network operates in conventional mode, one inductor terminal is still connected to the clock node, whereas the other inductor terminal is connected to one of the terminals of switch S, which generally presents a tangible, but relatively small, capacitance compared to the capacitance of the clock node. With the clock node switching at a high rate, the flow of current through the inductor to and from the switch S terminal capacitance generates high frequency components that distort the shape of the clock waveform on the main clock node. Moreover, the same flow of current through the inductor to and from the switch S terminal capacitance can drive the voltage of the switch S terminal capacitance to values that will momentarily allow the conduction of current through the NMOS and PMOS devices that are used to implement the switch S. To offset this conduction of current, the NMOS and PMOS devices driving the clock node must provide additional current to the clock node, resulting in increased energy consumption.

Figure 5:
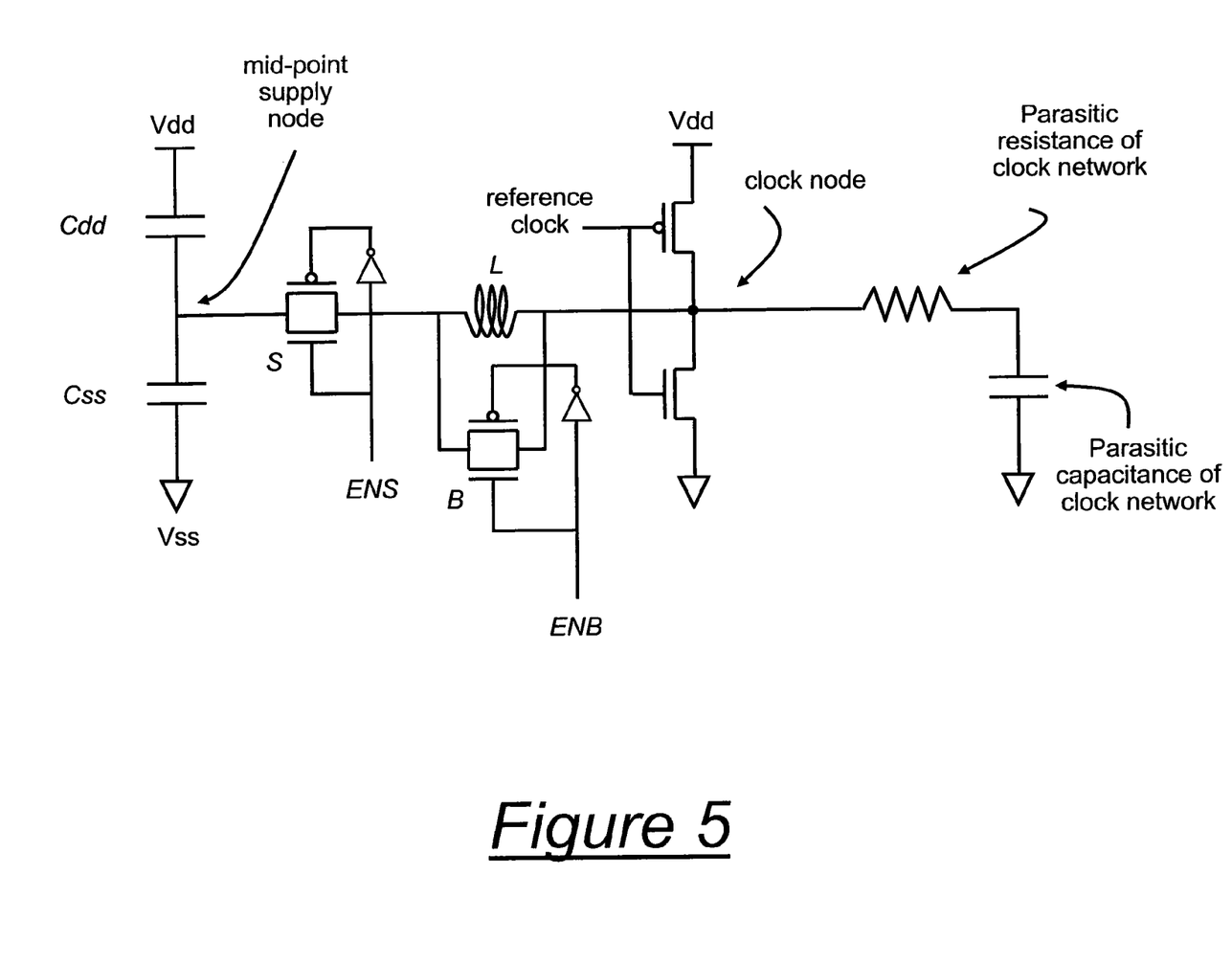
FIG. 5 shows an embodiment of the proposed approach for the design of a resonant clock driver that supports both resonant and conventional operation.

FIG. 5 shows an embodiment of the proposed architecture for supporting the energy efficient operation of a resonant clock network in conventional mode. In this embodiment, the resonant clock driver design from FIG. 4 has been augmented to include an additional switch B that is placed in parallel to the inductive element of the resonant clock driver. When the resonant clock network is operating in resonant mode, switch B is turned off using the control signal ENB. In this case, the switch does not conduct any current, and the inductor is connected to the resonant clock network. When the resonant clock network is operating in conventional mode, switch B is turned on, and the inductor is bypassed. Current build-up in the inductor is thus limited, reducing distortion in the shape of the clock waveform, and reducing momentary currents through switch S.

Figure 6:
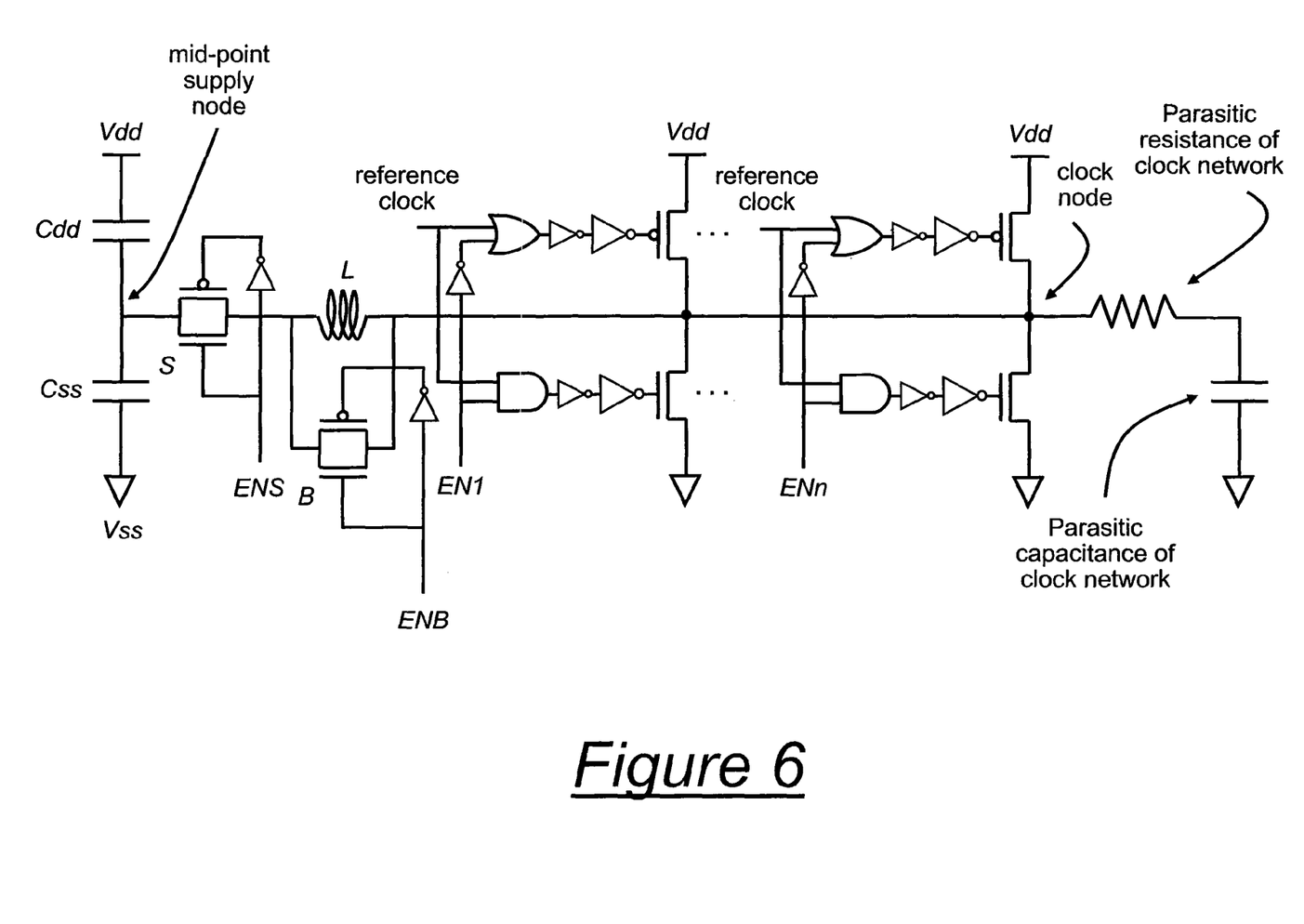
FIG. 6 shows an alternative embodiment of the proposed approach for the design of a resonant clock driver that supports both resonant and conventional operation.

An alternative embodiment of the proposed architecture is shown in FIG. 6. This embodiment is an extension of the embodiment shown in FIG. 5, in which the resonant clock driver includes multiple pairs of NMOS/PMOS devices to drive the clock node, that can be selectively enabled using control signals EN1, . . . , ENn.

Figure 7:
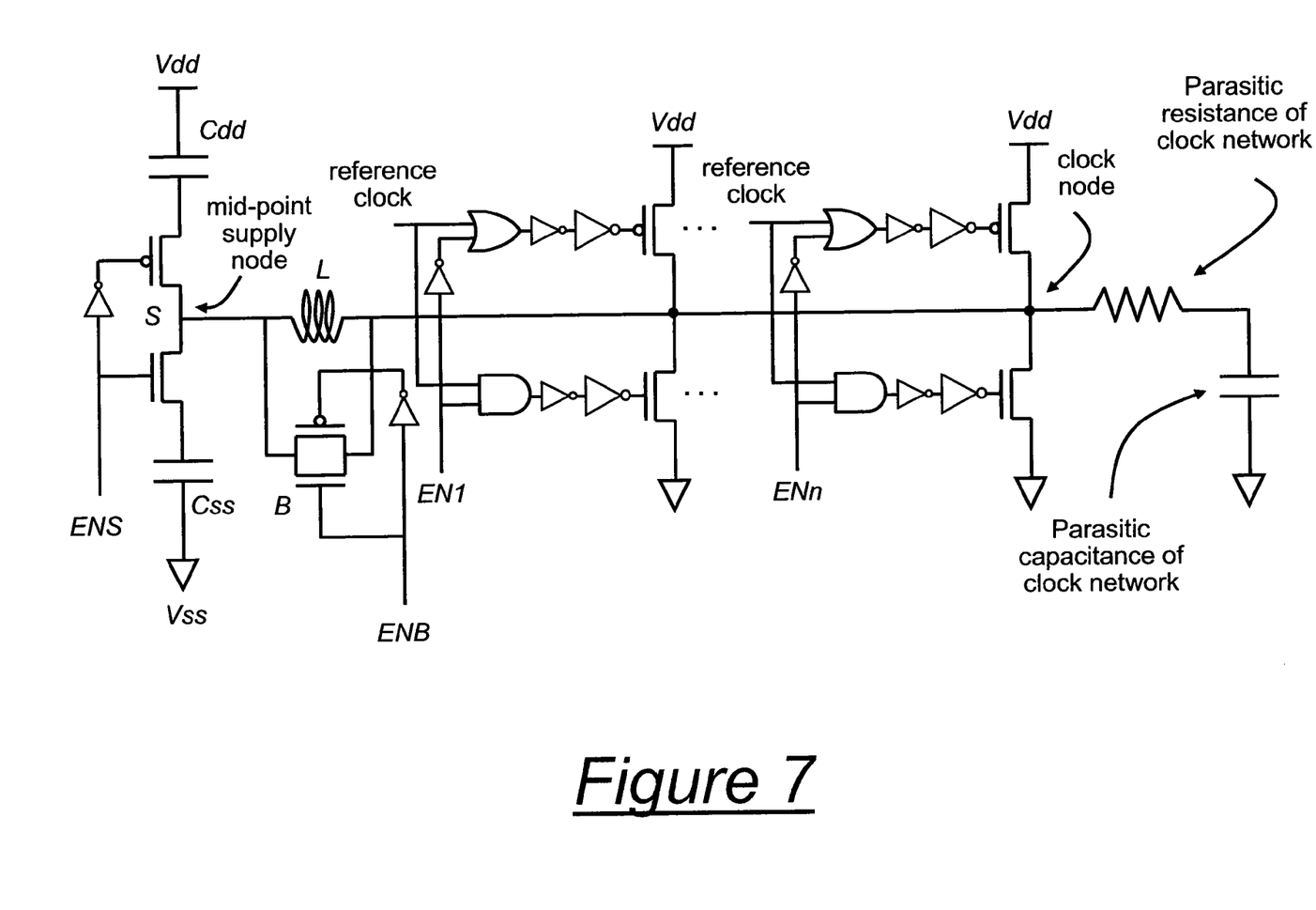
FIG. 7 shows another alternative embodiment of the proposed approach for the design of a resonant clock driver that supports both resonant and conventional operation.

Another alternative embodiment of the proposed architecture is shown in FIG. 7. This embodiment is an extension of the embodiment shown in FIG. 6, in which switch S has been relocated. Specifically, the PMOS device of the switch has been placed between the mid-point node, and the non-VDD terminal of the capacitor Cdd, and the NMOS device has been placed between the mid-point node and the non-VSS terminal of the capacitor Css.

Figure 8:
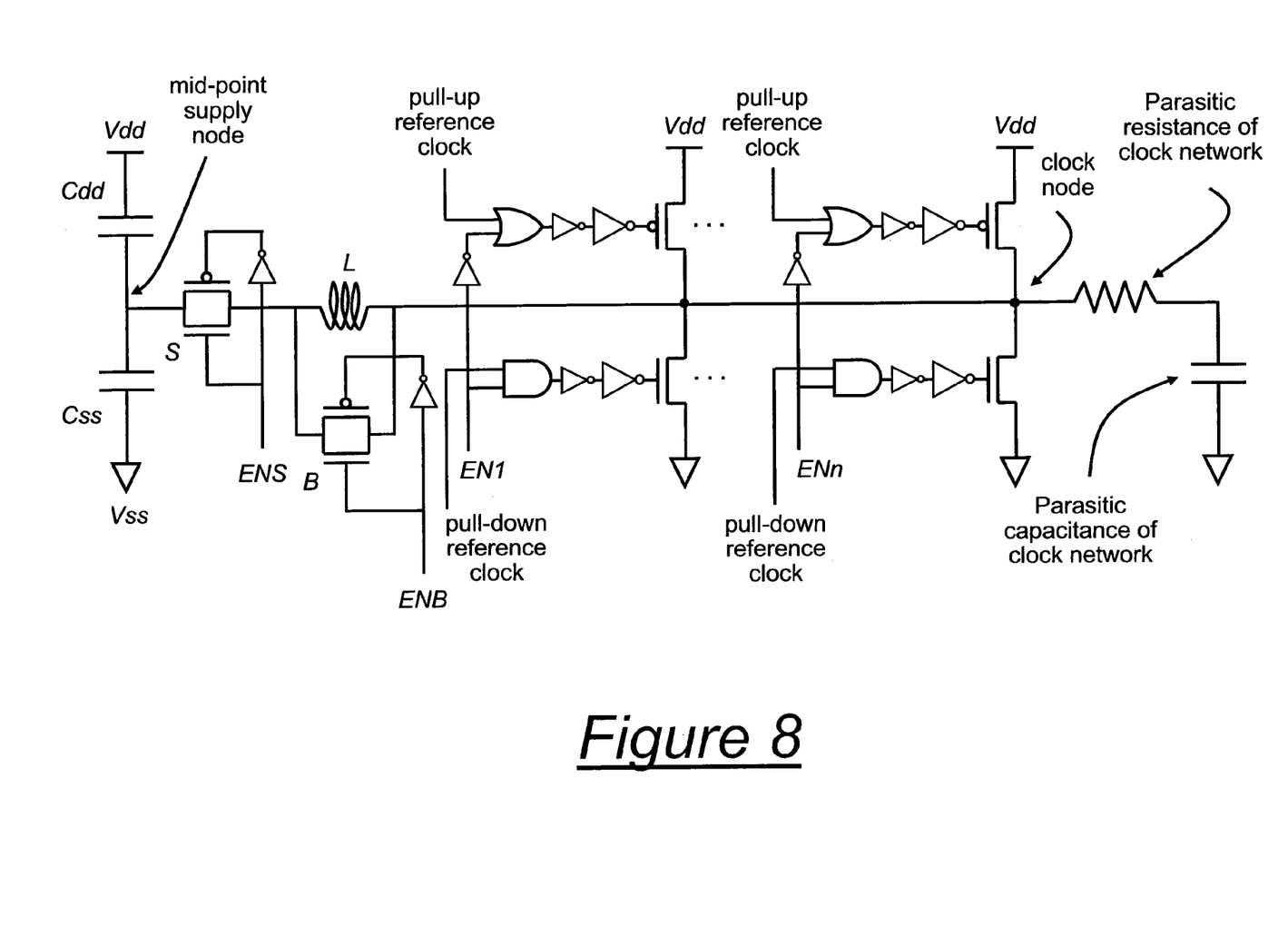
FIG. 8 shows another alternative embodiment of the proposed approach for the design of a resonant clock driver that supports both resonant and conventional operation.

FIG. 8 shows another alternative embodiment of the proposed architecture. This embodiment is an extension of the one shown in FIG. 6, in which the pull-down devices can be driven by a separate reference clock signal from the pull-up devices. This embodiment allows for the pull-up devices to be driven using a reference clock with a different duty cycle from the pull-down devices.

Unless the context clearly requires otherwise, throughout the description and the claims, the words "comprise," "comprising," and the like are to be construed in an inclusive sense (i.e., to say, in the sense of "including, but not limited to"), as opposed to an exclusive or exhaustive sense. As used herein, the terms "connected," "coupled," or any variant thereof means any connection or coupling, either direct or indirect, between two or more elements. Such a coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above Detailed Description of examples of the invention is not intended to be exhaustive or to limit the invention to the precise form disclosed above. While specific examples for the invention are described above for illustrative purposes, various equivalent modifications are possible within the scope of the invention, as those skilled in the relevant art will recognize. While processes or blocks are presented in a given order in this application, alternative implementations may perform routines having steps performed in a different order, or employ systems having blocks in a different order. Some processes or blocks may be deleted, moved, added, subdivided, combined, and/or modified to provide alternative or sub-combinations. Also, while processes or blocks are at times shown as being performed in series, these processes or blocks may instead be performed or implemented in parallel, or may be performed at different times. Further any specific numbers noted herein are only examples. It is understood that alternative implementations may employ differing values or ranges.

The various illustrations and teachings provided herein can also be applied to systems other than the system described above. The elements and acts of the various examples described above can be combined to provide further implementations of the invention.

Any patents and applications and other references noted above, including any that may be listed in accompanying filing papers, are incorporated herein by reference. Aspects of the invention can be modified, if necessary, to employ the systems, functions, and concepts included in such references to provide further implementations of the invention.

These and other changes can be made to the invention in light of the above Detailed Description. While the above description describes certain examples of the invention, and describes the best mode contemplated, no matter how detailed the above appears in text, the invention can be practiced in many ways. Details of the system may vary considerably in its specific implementation, while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed in the specification, unless the above Detailed Description section explicitly defines such terms. Accordingly, the actual scope of the invention encompasses not only the disclosed examples, but also all equivalent ways of practicing or implementing the invention under the claims.

While certain aspects of the invention are presented below in certain claim forms, the applicant contemplates the various aspects of the invention in any number of claim forms. For example, while only one aspect of the invention is recited as a means-plus-function claim under 35 U.S.C. §112, sixth paragraph, other aspects may likewise be embodied as a means-plus-function claim, or in other forms, such as being embodied in a computer-readable medium. (Any claims intended to be treated under 35 U.S.C. §112, ¶ 6 will begin with the words "means for.") Accordingly, the applicant reserves the right to add additional claims after filing the application to pursue such additional claim forms for other aspects of the invention.

We claim:

1. A clock driver comprising:
   a resonance element electrically coupled to a clock node of the clock driver, the resonance element configured to enable the clock driver to operate in a resonant mode;
   a drive element electrically coupled to the clock node, the drive element configured to receive and propagate a reference clock of a clock distribution network based on a logical input signal;
   a mid-point supply node configured to provide a power supply to the resonance element;
   a first switch element, wherein a first end of the first switch element is electrically coupled to the mid-point supply node and a second end of the first switch element is electrically coupled to a first end of the resonance element;
   a second switch element connected in parallel to the resonance element, wherein a first end of the second switch element is electrically coupled to the first end of the resonance element and a second end of the second switch element is electrically coupled to a second end of the resonance element;
   wherein the clock driver is configured to selectively operate either in a resonant mode or a non-resonant mode based on an operating state of the first switch element and the second switch element, wherein:
      when the first switch element is switched on and the second switch element is switched off, the clock driver operates in a resonant mode; and
      when the second switch element is switched on, the resonance element is bypassed and the clock driver operates in a non-resonant mode.

2. The clock driver of claim 1, wherein the first switch element is configured to be switched off when the clock driver operates in the non-resonant mode.

3. The clock driver of claim 1, wherein the drive element is comprised of a plurality of pull-up and pull-down devices, each of the plurality of devices being further configured to be selectively activated by a corresponding control signal.

4. The clock driver of claim 3, wherein one or more of the plurality of pull-up devices propagates a pull-up reference clock whose duty cycle differs from a duty cycle of a pull-down reference clock propagated by one or more of the plurality of pull-down devices.

5. The clock driver of claim 1, wherein the first switch element comprises at least one PMOS device.

6. The clock driver of claim 1, wherein the first switch element comprises at least one NMOS device.

7. A clock driver comprising:
   a resonance element electrically coupled to a clock node of the clock driver, the resonance element configured to enable the clock driver to operate in a resonant mode;
   a drive element electrically coupled to the clock node, the drive element configured to receive and propagate a reference clock based on a logical input signal;
   a mid-point supply node configured to provide a power supply to the resonance element;
   a first switch element electrically coupled between the mid-point supply node and the power supply associated with the mid-point supply node;
   a second switch element, wherein a first end of the second switch element is electrically coupled to a first end of the resonance element and a second end of the second switch element is electrically coupled to a second end of the resonance element;
   wherein the clock driver is configured to selectively operate either in a resonant mode or in a non-resonant mode based on an operating state of the first switch element and the second switch element, wherein:
      when the first switch element is switched on and the second switch element is switched off, the clock driver operates in the resonant mode; and
      when the second switch element is switched on, the resonance element is bypassed and the clock driver operates in the non-resonant mode.

8. The clock driver of claim 7, wherein the drive element is comprised of a plurality of pull-up and pull-down devices, each of the plurality of devices being further configured to be selectively activated by a corresponding control signal.

9. The clock driver of claim 8, wherein one or more of the plurality of pull-up devices propagates a pull-up reference clock whose duty cycle differs from a duty cycle of a pull-down reference clock propagated by one or more of the plurality of pull-down devices.

10. The clock driver of claim 7, wherein the first switch element comprises at least one PMOS device.

11. The clock driver of claim 7, wherein the first switch element comprises at least one NMOS device.

12. A method of operation of a clock driver, the method comprising:
   electrically coupling a resonance element to a clock node of the clock driver, the resonance element configured to enable the clock driver to operate in a resonant mode;
   electrically coupling a drive element to the clock node, the drive element configured to receive and propagate a reference clock based on a logical input signal;

providing a mid-point supply node to supply power to the resonance element;

electrically coupling a first end of a first switch element to the mid-point supply node and electrically coupling a second end of the first switch element to a first end of the resonance element;

electrically coupling a first end of a second switch element to the first end of the resonance element and electrically coupling a second end of the second switch element to a second end of the resonance element;

selectively configuring the clock driver to operate either in a resonant mode or in a non- resonant mode based on an operating state of the first switch element and an operating state of the second switch element, wherein:
when the first switch element is switched on and the second switch element is switched off, the clock driver operates in the resonant mode; and
when the second switch element is switched on, the resonance element is bypassed and the clock driver operates in the non-resonant mode.

13. The method of claim 12, further comprising:
selecting to operate the clock driver in the non-resonant mode when it is desired to operate the clock driver at a frequency that does not approximate a natural resonating frequency of the resonance element.

14. The method of claim 12, further comprising:
electrically coupling a plurality of pull-up and pull-down devices to the clock node, each of the plurality of pull-up and pull-down devices being further configured to receive and propagate a reference clock of the clock driver based on a corresponding control signal, wherein the pull-up and pull-down devices propagate the corresponding reference clock when the control signal is in an active state; and
adjusting the control signals to change the number of pull-up and pull-down devices propagating the corresponding reference clock.

15. The method of claim 14, wherein one or more of the plurality of pull-up devices propagates a pull-up reference clock whose duty cycle differs from a duty cycle of a pull-down reference clock propagated by one or more of the plurality of pull-down devices.

16. The clock driver of claim 12, wherein the first switch element comprises at least one PMOS device.

17. The clock driver of claim 12, wherein the first switch element comprises at least one NMOS device.

18. The clock driver of claim 12, wherein the second switch element is connected in parallel to the resonance element.

* * * * *